United States Patent [19]
Brehmer

[11] Patent Number: 5,739,721
[45] Date of Patent: Apr. 14, 1998

[54] HOGH SWING, LOW POWER OUTPUT STAGE FOR AN OPERATIONAL AMPLIFIER

[75] Inventor: Geoffrey E. Brehmer, Lexington, Tex.

[73] Assignee: Advanced Micro Devices, Inc., Sunnyvale, Calif.

[21] Appl. No.: 600,841

[22] Filed: Feb. 13, 1996

[51] Int. Cl.$^6$ .................... H03F 3/45; H03F 1/14
[52] U.S. Cl. .................... 330/253; 330/292
[58] Field of Search .................... 330/253, 255, 330/277, 292

[56] References Cited

U.S. PATENT DOCUMENTS

| | | | |
|---|---|---|---|
| 5,212,455 | 5/1993 | Pernici et al. | 330/253 |
| 5,406,220 | 4/1995 | Jones et al. | 330/292 X |
| 5,457,426 | 10/1995 | Brehmer | 330/253 |
| 5,477,190 | 12/1995 | Brehmer et al. | 330/253 |
| 5,493,251 | 2/1996 | Khambaty et al. | 327/564 |
| 5,515,003 | 5/1996 | Kimura | 330/253 |
| 5,589,785 | 12/1996 | Garavan | 330/253 X |

FOREIGN PATENT DOCUMENTS 2 251 745  7/1992  United Kingdom .

OTHER PUBLICATIONS

R.K. Hester, et al., "Fully Differential ADC with Rail-to-Rail Common–Mode Range and Nonlinear Capacitor Compensation," *IEEE Journal of Solid–State Circuits*, vol. 25, No. 1, pp. 173–182 (2/90).

M. Milkovic, "Current Gain High–Frequency CMOS Operational Amplifiers," *IEEE Journal of Solid–State Circuits*, vol. SC–20, No. 4, pp. 845–851 (8/85).

*Primary Examiner*—Steven Mottola
*Attorney, Agent, or Firm*—Joseph W. King, Jr.; Stanford & Bennett, L.L.P.

[57] ABSTRACT

A high swing, low power output stage for an operational amplifier is provided which includes: 1) a folded-cascode gain stage having a differential pair of natural $V_T$ devices, which are preferably P-channel transistors; 2) a source-follower input stage connected to the folded-cascode gain stage and to the input of the high swing output stage; and 3) a source-follower output stage connected to the folded-cascode gain stage connected to an output of the source-follower stage and to the output of the high swing output stage. The high swing output stage also includes a compensation capacitor which is used to provide dominant pole frequency compensation for the high swing output stage.

12 Claims, 5 Drawing Sheets ns
HOGH SWING, LOW POWER OUTPUT STAGE FOR AN OPERATIONAL AMPLIFIER

BACKGROUND OF THE INVENTION

1. Field of the Invention

This invention relates to a high swing, low power output stage for an operational amplifier.

2. Discussion of the Related Technology

Highly linear output stages for power amplifiers or general purpose operational amplifiers (op amps) have been utilized in the electronic industry and the telecommunication markets for many years. The advent of battery powered components has placed new strains on analog designers to produce the same or higher performances with less power supply voltage. The linear output stage of an op amp has traditionally been utilized with power amplifiers where driving very low resistive and highly capacitive loads was typical; but today, having a linear output stage for the general purpose integrated circuit op amp capable of driving moderate resistive and capacitive loads with as little quiescent current as possible is very desirable for battery powered applications. Having an output stage having an extended voltage range allows for lower power circuits to exhibit similar dynamic range performance as amplifiers with higher power supplies.

Traditionally, in the prior art, the most common types of output stages utilized with the op amp architecture are: 1) Class A output, 2) pseudo push-pull output; and 3) Class AB having full push-pull outputs. Each architecture is illustrated in FIGS. 1–3. FIG. 1 illustrates the very linear Class A structure. Its performance is the best of the three architectures, but the power consumption is the highest since the quiescent current must meet or exceed the specified drive current. The pseudo push-pull output stage of FIG. 2 is implemented with an emitter-follower, or source-follower, sourcing device and a push-pull sinking device.

As illustrated in FIG. 2, the sinking device is driven from the output of the differential amplifier. The linearity and power consumption are both quite good, but the voltage swing is limited by the turn-on voltage required by the differential input pair.

The structure shown in FIG. 3 illustrates a Class AB configuration. Here, the output includes full push-pull operation on both sinking and sourcing devices. This structure has the largest voltage swing and the lowest quiescent power, but may exhibit linearity problems due to one transistor turning on and the other turning off during one half the voltage swing and vice versa in the opposite half.

SUMMARY OF THE INVENTION

The present invention implements a high swing, low power output stage for a general purpose operational amplifier. The present output stage includes two types of enhancement mode transistors—a natural $V_T$ device and an implant adjust $V_T$ device. The natural devices have a lower doping concentration in the channel, hence, a much lower threshold voltage. The implant adjust $V_T$ devices have a higher doping concentration under the gate to increase the threshold voltage and guarantee that the device has a very low leakage current for $V_{GS}=0$ and variation in manufacturing process, temperature and power supply. The natural transistor has a $V_T$ near zero volts (i.e. approximately 0.1 v) and can become leaky and unable to turn off.

The present invention strategically places the natural devices within the circuit architecture such that the leakage current will not hinder the operation of the output stage, or the op amp to which the output stage is connected. In the output stage of the present invention, natural $V_T$ devices are placed exclusively as input differential pairs or source-follower structures. By using a mixture of natural and enhancement type transistors, and strategically arranging them in a high swing circuit architectures, the present invention has simpler construction and higher signal swing.

DETAILED DESCRIPTION OF THE PREFERRED EMBODIMENT

Figure 1:
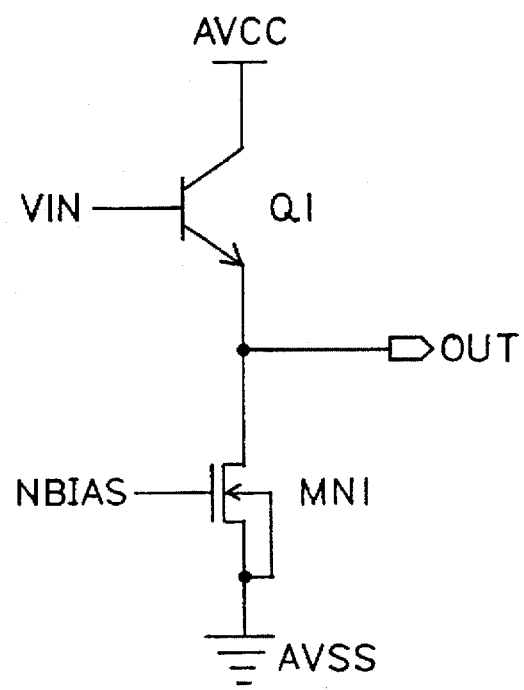
FIG. 1 is a schematic diagram of a Class A emitter-follower output stage of the prior art.
Figure 2:
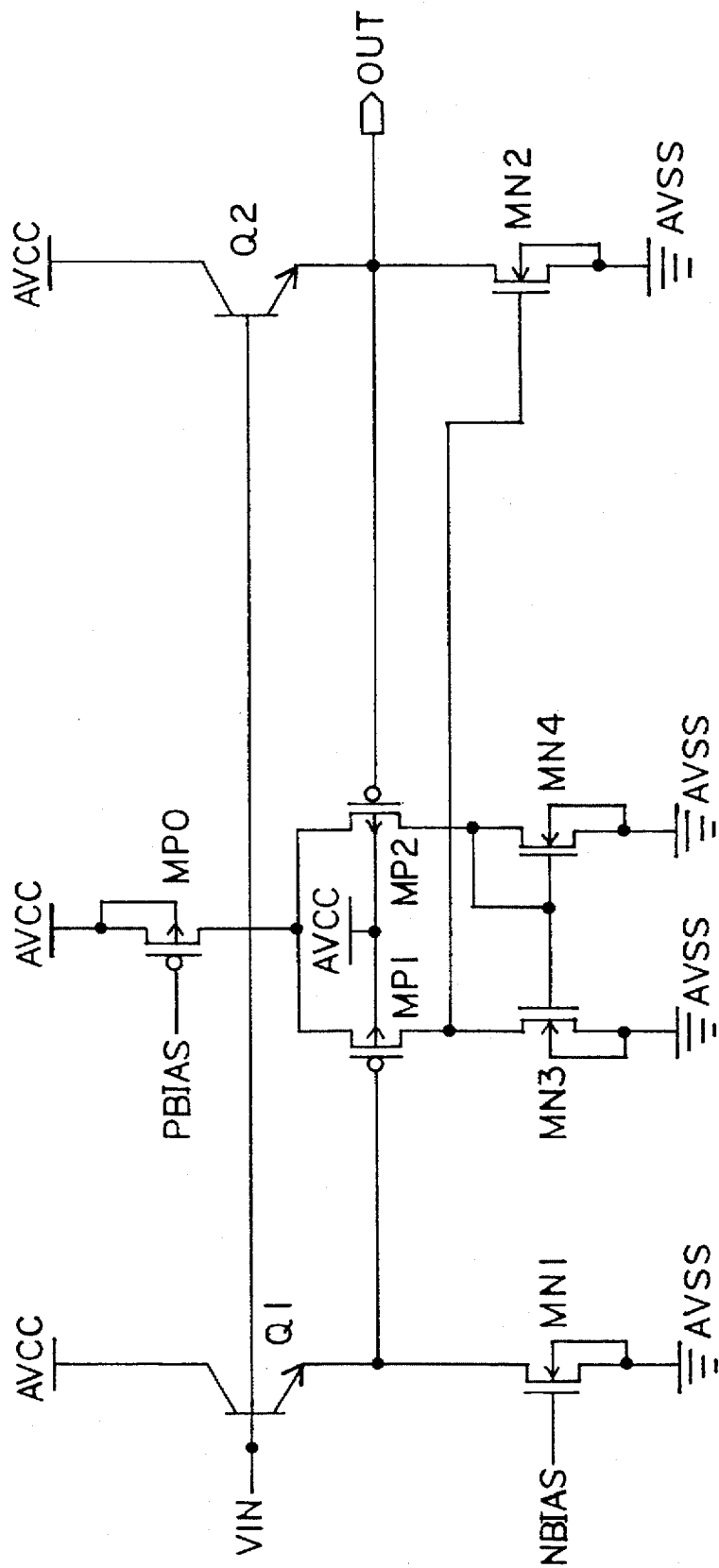
FIG. 2 is a schematic diagram of a pseudo push-pull output stage of the prior art.
Figure 3:
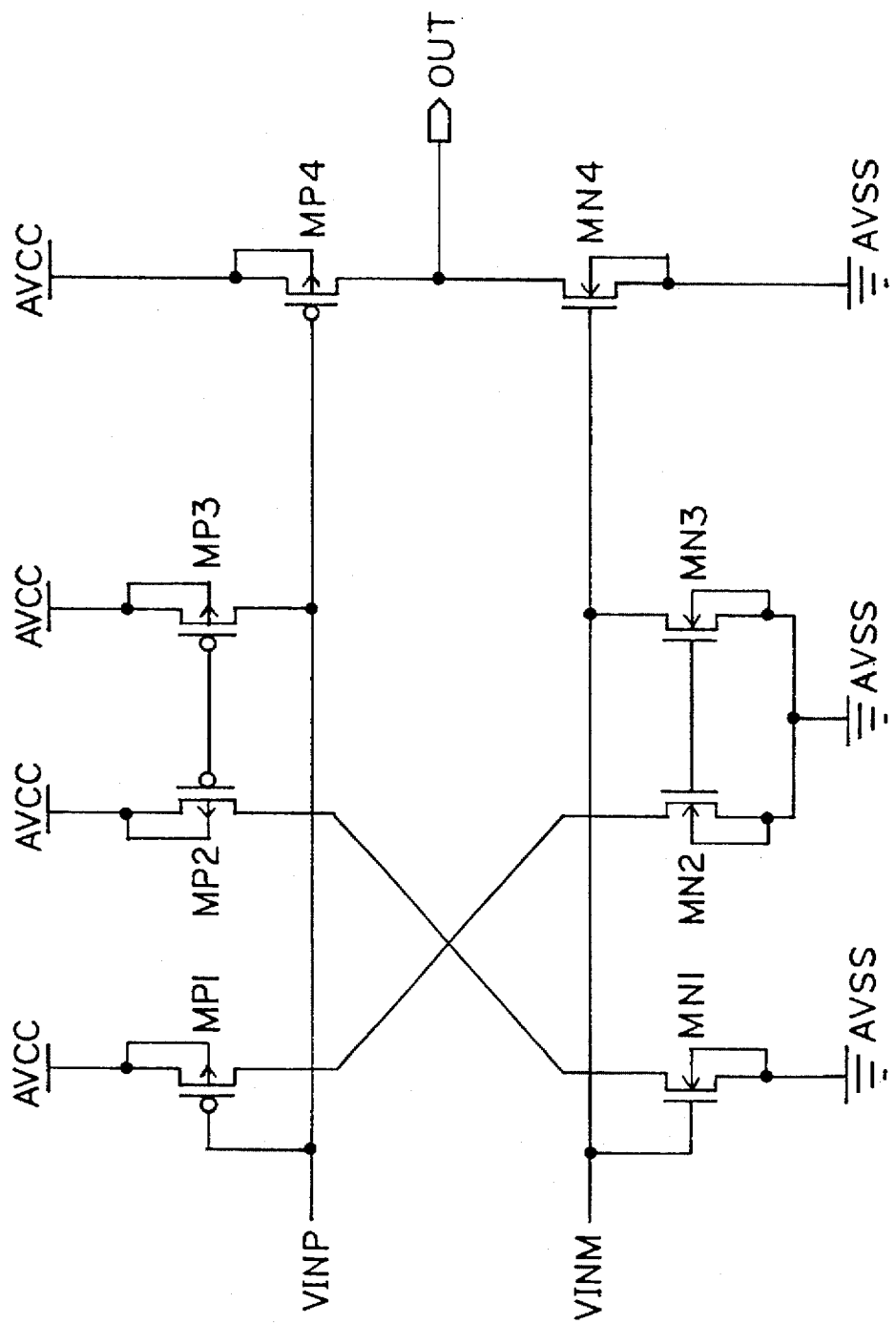
FIG. 3 is a schematic diagram of a Class AB full push-pull output stage of the prior art.
Figure 4:
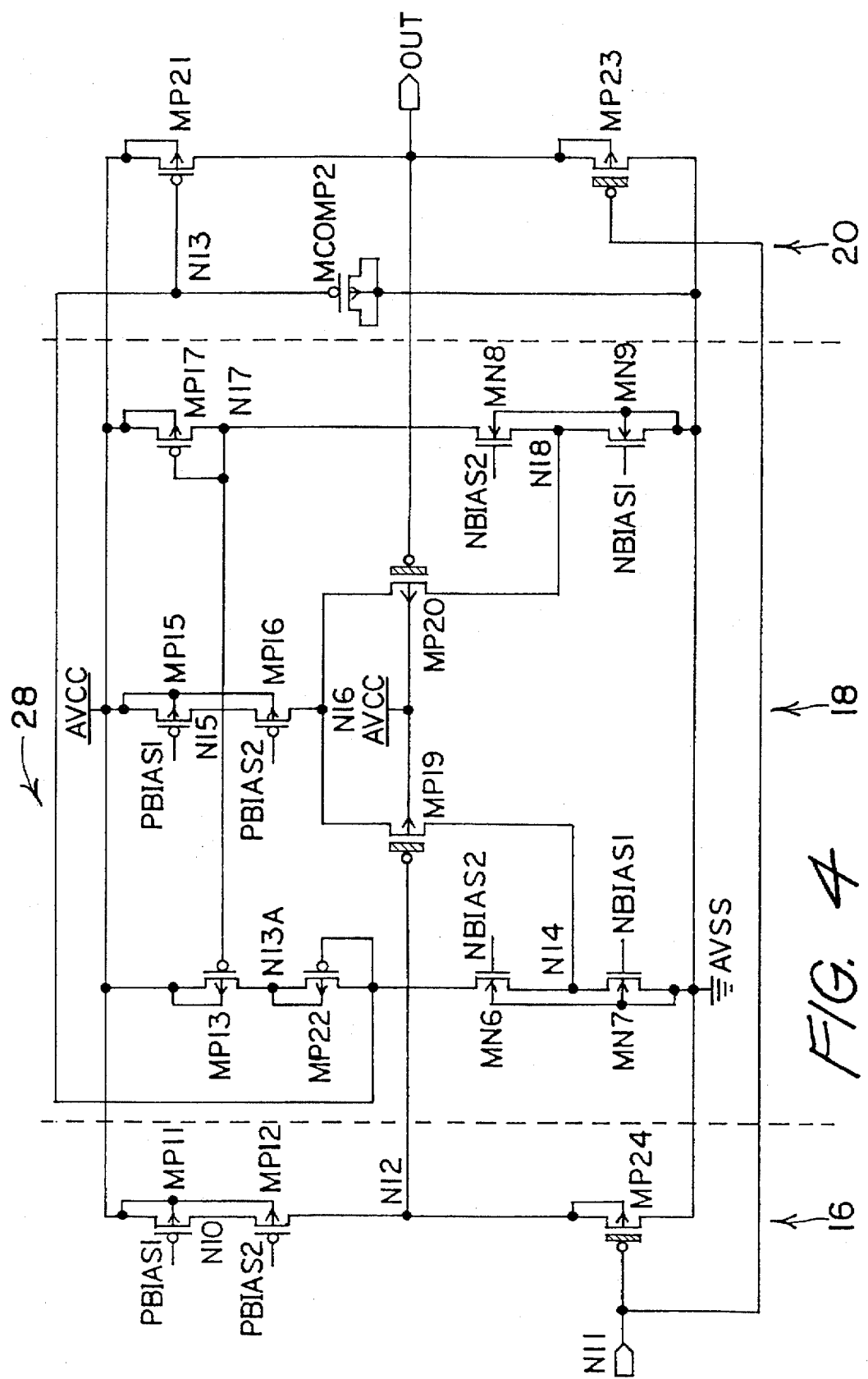
FIG. 4 is a schematic diagram of one embodiment of the high swing, low power output stage of the present invention.

The high swing output stage 28 of the present invention is illustrated in FIG. 4. This output stage 28 includes slave source follower stage 16, voltage limited folded-cascode gain stage 18 and source follower output stage 20. The intended function of high swing output stage 28 is to isolate a front end op amp (not shown) connected to it from resistive or capacitive loading and to provide addition current sinking and sourcing capabilities when driving higher capacitance and lower resistance loads. In addition, output stage 28 isolates the output of the front end op amp from resistive and capacitive loading, thereby increasing linearity and decreasing distortion for the op amp.

An additional feature of high swing output stage 28 is the use of natural $V_T$ devices, which are preferably P-channel transistors, denoted in FIG. 4 as MP19, MP20, MP23, and MP24. These natural devices are utilized in conjunction with normal enhancement type devices, or switching devices, denoted in FIG. 4 as MP11, MP12, MP13, MP22, MP15, MP16, MP17, MP21, MN6, MN7, MN8 and MN9, to implement a nearly rail-to-rail voltage swing. Dominant pole frequency compensation for high swing output stage 28 is accomplished using compensation capacitor MCOMP2. This configuration establishes a single dominate pole frequency compensation independent of output loading of the front end op amp to which output stage 28 is connected, making output stage 28 stable for various resistive and capacitive loads.

In general, natural $V_T$ devices have a lower doping concentration in the channel, hence, a much lower threshold voltage. Generally, implant adjust $V_T$ devices have a higher doping concentration under the gate to increase the threshold voltage and guarantee that the device has very little leakage current with $V_{GS}=0$ and for variations in process, supply and temperature. The natural transistor has a $V_T$ near zero volts (i.e. approximately 0.1 v) and can become leaky and unable to turn off for variations in temperature, process and power supply.

Bias signals PBIAS1 and PBIAS2 provide the bias for the respective enhancement P-channel transistors designated MP11, MP12, MP15 and MP16. Bias signals NBIAS1 and NBIAS2 provide the bias for the respective enhancement N-channel transistors designated MN6, MN7, MN8 and MN9.

The operation of high swing output stage 28 is as follows: The analog input signal to output stage 28 is received on node N11 from any suitable op amp output. Slave source follower stage 16 is a classical level shifter having a AC unity gain which level shifts the signal on node N11, by a voltage $V_T$ from a natural device, transistor MP24, and drives node N12. The source follower output stage 20 provides additional current sourcing capabilities due to the folded-cascode gain stage 18. As node N11 swings low, nodes N12 and OUT will follow N11, being level shifted by voltage $V_T$ of natural devices MP24 and MP23, respectively. As N11 swings high, nodes N12 and OUT will swing high shifted by voltage $V_T$ of natural devices MP24 and MP23, respectively.

A unique feature of slave source-follower 16 and folded cascode gain stage 18 is its ability to control the quiescent current in output stage 20 by maintaining the same $V_{GS}$ and $V_{DS}$ across transistors MP24 and MP23. Transistors MP24 and MP23 share a common gate and common source, hence their $V_{GS}$ is the same. The controlled current in output stage 20 is accomplished by gain stage 18 controlling the gate voltage on MP21 such that node OUT is at the same voltage potential as node N12, thereby maintaining exact $V_{DS}$ on transistors MP24 and MP23. Identically sized transistors, or ratiometric sized transistors, having similar $V_{GS}$ and $V_{DS}$ act as current mirroring structures.

Transistor MP23 of output stage 20 is a simple source-follower such that the node OUT follows node N11 by a voltage $V_T$ of natural device MP23. Transistor MP21 is a push-pull sourcing device, whereby as output stage 20 drives high, gain stage 18 pushes node N13 toward $V_{SS}$, allowing transistor MP21 to source more current until node OUT matches the potential on node N12. Conversely, as output stage 28 drives low, gain stage 18 pulls node N13 to $V_{CC}$, thus lowering the drive on MP21.

As shown in FIG. 4, an improvement to gain stage 18 is the addition of GM (diode connected) transistor MP22. This device prevents node N13 from collapsing to $V_{CC}$ when output stage 28 is driving low. By preventing node N13 from collapsing to $V_{CC}$, MP21 is continually conduction a small amount of current and improves the linearity and transient response observed in output stage 28.

Figure 5:
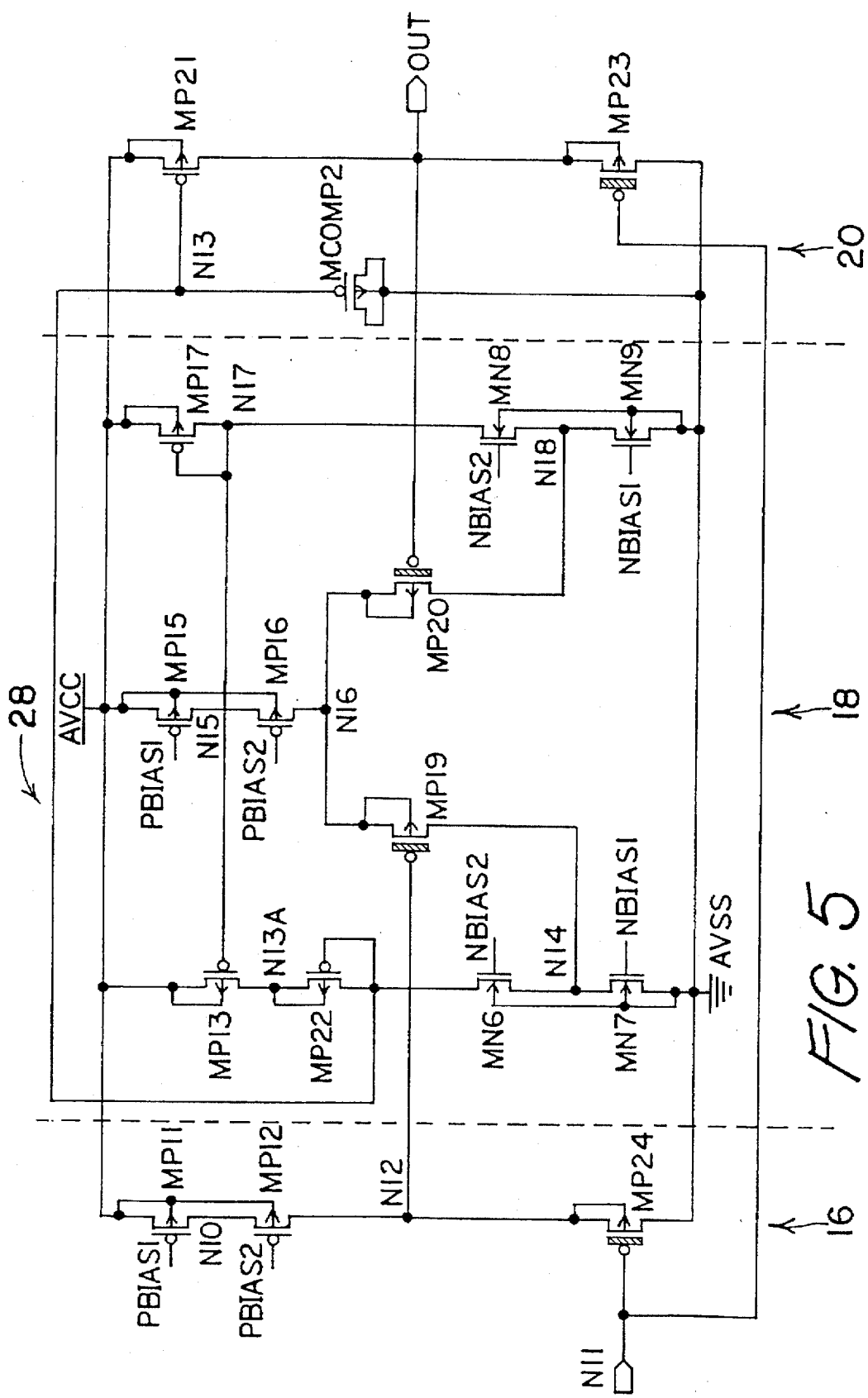
FIG. 5 is a schematic diagram of another embodiment of the high swing, low power output stage of the present invention.

FIG. 5 illustrates an additional embodiment for the present invention which utilizes natural devices MP19 and MP20 which have their respective bulk terminals connected to their respective source terminals. This configuration further reduces the threshold, $V_T$, for these natural devices and allows the output stage 28 to achieve even greater common mode signal swing than the embodiment illustrated in FIG. 4. Otherwise, the operation of architecture of FIG. 5 is substantially the same as that depicted in FIG. 4.

What is claimed is:

1. A high swing, low power output stage for an operational amplifier, comprising:

(a) a source follower input stage having an output and having an input connected to a signal output from an operational amplifier;

(b) a folded-cascode gain stage having an output and having an input connected to said output of said source follower input stage; and (c) a source follower output stage having an output and having an input connected to said signal output from said operational amplifier, wherein said source follower output is connected to an output of said high swing output stage; and (d) a current sourcing device having an input connected to said folded-cascode gain stage output, and having an output connected to said source follower output stage output.

2. The output stage of claim 1, wherein said source follower input stage is of a class A type configuration.

3. The output stage of claim 1, wherein said source follower output stage is of a pseudo push-pull configuration.

4. A high swing, low power output stage for an operational amplifier, comprising:

(a) a folded-cascode gain stage having a differential pair of natural $V_T$ devices;

(b) a first natural $V_T$ device connected to an input of said high swing output stage; and (c) a second natural $V_T$ device connected to an output of said high swing output stage; wherein said second natural $V_T$ device is also connected to a compensation capacitor; and wherein said low power output stage further comprises a source follower output stage, wherein said compensation capacitor is connected to said source follower output stage.

5. The output stage of claim 4, wherein said natural $V_T$ devices are P-channel transistors.

6. A high swing, low power output stage for an operational amplifier, comprising:

(a) a folded-cascode gain stage having a differential pair of natural $V_T$ devices;

(b) a first natural $V_T$ device connected to an input of said high swing output stage; and (c) a second natural $V_T$ device connected to an output of said high swing output stage; wherein said high swing output stage includes a source follower input stage and a source-follower output stage, wherein said first natural $V_T$ device is connected to said source follower input stage, and wherein said second natural $V_T$ device is connected to said source follower output stage.

7. A high swing, low power output stage for an operational amplifier, comprising:

(a) a source follower input stage having an output and having an input connected to a signal output from an operational amplifier;

(b) a folded-cascode gain stage having an output and having a differential pair of natural $V_T$ devices and an input connected to said output of said source follower input stage; and (c) a source follower output stage having an input connected to said output of said folded-cascode gain stage, wherein said source follower output stage includes a compensation capacitor connected to a second pair of natural $V_T$ devices, wherein one of said natural $V_T$ devices of said second pair is connected to said input of said source follower input stage and the other of said natural $V_T$ devices is connected to an output of said high swing output stage.

8. A method of maintaining a controlled quiescent current at the output of an output stage for an operational amplifier, comprising the steps of:

(a) providing an output stage for an operational amplifier, wherein said output stage comprises: a slave source follower stage having an output, a voltage limited folded-cascode gain stage having an output, and a source follower output stage having an output;

(b) providing a push-pull sourcing device in said source follower output stage;

(c) providing a first natural $V_T$ device in said slave source follower stage, and a second natural $V_T$ device in said source follower output stage;

(d) maintaining about the same $V_{DS}$ across said first and said second natural $V_T$ devices; and (e) maintaining a voltage on said output of said source follower output stage which is about equal to a voltage on said output of said slave source follower stage by providing a gate voltage to said push-pull sourcing device from said output of said voltage limited folded-cascode gain stage.

9. A method of maintaining a controlled quiescent current at the output of an output stage for an operational amplifier, comprising the steps of:

(a) providing a high swing, low power output stage for an operational amplifier, which includes: 1) a source follower input stage having an output and having an input connected to a signal output from an operational amplifier;

2) a folded-cascode gain stage having an output and having an input connected to said output of said source follower input stage; and 3) a source follower output stage having an output and having an input connected to said output of said folded-cascode gain stage, wherein said source follower output is connected to an output of said high swing output stage;

(b) providing a first natural $V_T$ device which is connected to an output of said high swing output stage;

(c) providing a second natural $V_T$ device which is connected to said input of said source follower input stage;

(d) providing a first switching device having an output, and being connected to said folded-cascode gain stage;

(e) providing a second switching device having an input, and being connected to said source follower output stage; and (f) providing a connection between said output of said first switching device and said input of said second switching device, wherein said first switching device prevents said input of said second switching device from reaching ground potential ($V_{CC}$) when said high swing, low power output stage is driving low.

10. The method of claim 9, wherein the bulk and gate of said first switching device are connected together.

11. The method of claim 9, wherein said first switching device is a diode connected transistor.

12. The output stage of claim 7, wherein said differential pair of natural $V_T$ devices have their respective source terminal connected to their respective gate terminal.

* * * * *

UNITED STATES PATENT AND TRADEMARK OFFICE
CERTIFICATE OF CORRECTION

PATENT NO. : 5,739,721

DATED : April 14, 1998

INVENTOR(S) : G. Brehmer

It is certified that error appears in the above-identified patent and that said Letters Patent is hereby corrected as shown below:

Column 3, line 44, delete "conduction" and insert therefore -- conducting --

Signed and Sealed this

Twenty-third Day of March, 1999

Attest:

Q. TODD DICKINSON

*Attesting Officer*

*Acting Commissioner of Patents and Trademarks*